(12) United States Patent
Wuidart et al.

(10) Patent No.: US 7,372,359 B2
(45) Date of Patent: May 13, 2008

(54) PROGRAMMABLE-CODE ELECTROMAGNETIC TRANSPONDER

(75) Inventors: Luc Wuidart, Pourrieres (FR); Michel Bardouillet, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 203 days.

(21) Appl. No.: 10/364,760

(22) Filed: Feb. 11, 2003

(65) Prior Publication Data

US 2003/0151498 A1 Aug. 14, 2003

(30) Foreign Application Priority Data

Feb. 11, 2002 (FR) ................................. 02 01642

(51) Int. Cl.
*H04Q 5/22* (2006.01)
(52) U.S. Cl. .................... 340/10.1; 340/10.2; 340/10.3
(58) Field of Classification Search ...... 340/5.22–5.25, 340/10.51, 10.52, 572.4, 572.7, 10.1, 10.2, 340/10.3, 10.4, 10.5, 10.6; 455/226.1, 226.2, 455/41; 345/41; 716/1; 438/301, 382; 257/536
See application file for complete search history.

(56) References Cited

U.S. PATENT DOCUMENTS

| | | | | |
|---|---|---|---|---|
| 3,299,424 A | * | 1/1967 | Vinding ..................... 340/10.3 |
| 4,231,458 A | | 11/1980 | Limone et al. |
| 4,333,072 A | * | 6/1982 | Beigel ..................... 340/10.34 |
| 4,388,524 A | * | 6/1983 | Walton ..................... 235/380 |
| 4,517,563 A | * | 5/1985 | Diamant ................... 340/10.42 |
| 4,695,840 A | * | 9/1987 | Darilek ..................... 340/10.33 |
| 5,021,767 A | * | 6/1991 | Fockens et al. ........... 340/10.34 |
| 5,536,947 A | | 7/1996 | Klersy et al. |
| 5,536,968 A | | 7/1996 | Crafts et al. |
| 5,801,372 A | * | 9/1998 | Yamaguchi ................. 235/492 |
| 5,809,518 A | * | 9/1998 | Lee ........................... 711/115 |
| 5,976,943 A | * | 11/1999 | Manley et al. ............. 438/382 |
| 6,172,608 B1 | * | 1/2001 | Cole ......................... 340/572.1 |
| 6,532,568 B1 | * | 3/2003 | Kotowski ..................... 716/1 |
| 6,791,356 B2 | * | 9/2004 | Haycock et al. ............. 326/82 |

FOREIGN PATENT DOCUMENTS

| | | |
|---|---|---|
| EP | 0 828 229 A1 | 3/1998 |
| GB | 2 279 474 A | 1/1995 |

OTHER PUBLICATIONS

French Search Report from French Patent Application No. 02/01642, filed Feb. 11, 2002.

* cited by examiner

*Primary Examiner*—Brian Zimmerman
*Assistant Examiner*—Nam Nguyen
(74) *Attorney, Agent, or Firm*—Lisa K. Jorgenson; William R. McClellan; Wolf, Greenfield & Sacks, P.C.

(57) ABSTRACT

An electromagnetic transponder including: a parallel oscillating circuit adapted to extracting a supply signal from a radiated field; in parallel with the oscillating circuit, several branches each including a programmable resistor and a switch; and a cyclic control element for successively turning on the switches, each resistor forming an element for storing a portion of the code stored in the transponder.

27 Claims, 2 Drawing Sheets

PROGRAMMABLE-CODE ELECTROMAGNETIC TRANSPONDER

BACKGROUND OF THE INVENTION

1. Field of the Invention

The present invention relates to an electromagnetic transponder, that is, a transceiver (most often, mobile) capable of being interrogated in a contactless and wireless manner by a unit (generally fixed), called a read and/or write terminal. Generally, transponders extract the power supply required by the electronic circuits included therein from a high frequency field radiated by an antenna of the read/write terminal. There exist read-only transponders, that is, transponders adapted to operating with a terminal which only reads transponder data, and read/write transponders, which contain data that can be modified by the terminal.

2. Discussion of the Related Art

Systems using electromagnetic transponders are based on the use of oscillating circuits including a winding forming an antenna, on the transponder side and on the read/write terminal side. These circuits are capable of being coupled by close magnetic field when the transponder enters the field of the read/write terminal.

Figure 1:
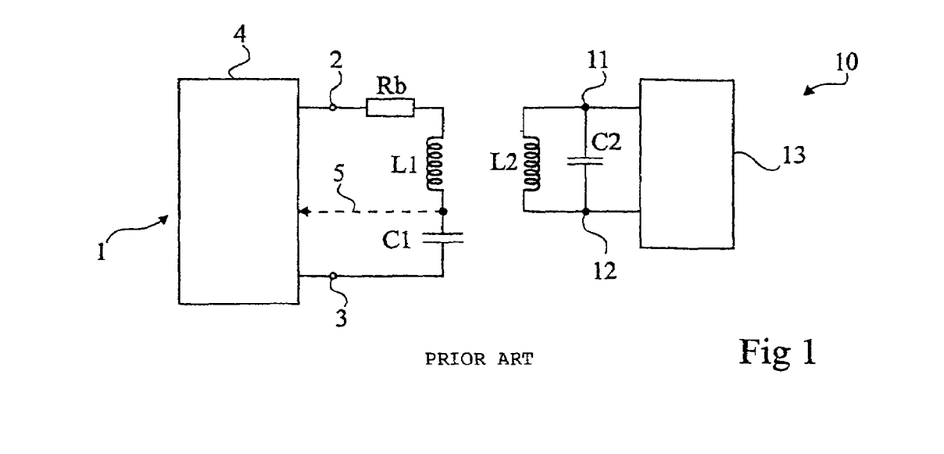
FIG. 1, previously described, very schematically shows an example of a system of communication with an electromagnetic transponder to which the present invention applies.

FIG. 1 very schematically shows a conventional example of a data exchange system between a read/write terminal 1 and a transponder 10 of the type to which the present invention applies.

Generally, terminal 1 is essentially formed of a series oscillating circuit formed of an inductance L1 in series with a capacitor C1 and a resistor Rb, between an output terminal 2 of an amplifier or antenna coupler (not shown) and a reference terminal 3 (generally the ground). The antenna coupler belongs to a circuit 4 for controlling the oscillating circuit and for exploiting the received data including, among others, a modulator-demodulator and a microprocessor for processing the control signals and the data. Circuit 4 of the terminal generally communicates with different input/output circuits (keyboard, screen, means of exchange with a server, etc.) and/or processing circuits, not shown. The circuits of the read/write terminal generally draw the power required by their operation from a supply circuit (not shown) connected, for example, to the electric supply system.

A transponder 10, capable of cooperating with a terminal 1, essentially includes a parallel oscillating circuit formed of an inductance L2, in parallel with a capacitor C2 between two A.C. input terminals 11, 12 of a control and processing circuit 13. Terminals 11 and 12 are, in practice, connected to the input of a rectifying means (not shown in FIG. 1) the outputs of which form D.C. supply terminals of the circuits internal to the transponder. These circuits generally include, essentially, a microprocessor or a circuit in wired logic, a memory, a demodulator of the signals that may be received from terminal 1, and a modulator for transmitting information to the terminal. For example, in the case of an electronic label to which the present invention more specifically applies, this information is most often formed of a (binary) code enabling the processing system, on the side of terminal 1, to identify the product with which the label is associated.

The oscillating circuit of terminal 1 is excited by a high-frequency signal (for example, at 13.56 MHz) capable of being sensed by a transponder 10. When transponder 10 is in the field of terminal 1, a high-frequency voltage is generated across terminals 11, 12 of the transponder's resonant circuit. This voltage, after being rectified and possibly clipped, provides the supply voltage of electronic circuits 13 of the transponder.

The oscillating circuits of the terminal and of the transponder are generally tuned on the same frequency corresponding to the frequency of the excitation signal of the oscillating circuit of terminal 1. This high-frequency signal (for example, 13.56 MHz) is used as a remote supply carrier for the transponders located in the terminal's field and, when necessary, as a data transmission carrier from the terminal to this (these) transponder(s). When a transponder is in the field of a terminal 1, a high-frequency voltage is generated across terminals 11 and 12 of the transponder's resonant circuit. This voltage, after rectification and possible clipping, provides the supply voltage of electronic circuits 13 of the transponder.

The high-frequency carrier transmitted by the terminal is generally modulated in amplitude by said terminal according to different coding techniques to transmit data and/or control signals to one or several transponders in the field. In return, the data transmission from the transponder to a terminal is generally performed by modulating the load formed by resonant circuit L2, C2. The load variation (called a back modulation) is performed at the rate of a sub-carrier having a frequency (for example, 847.5 kHz) smaller than that of the carrier. This load variation can then be detected by the terminal as an amplitude variation or as a phase variation by means, for example, of a measurement of the voltage across capacitor C1 or of the current in the oscillating circuit. In FIG. 1, the measurement signal has been symbolized by a connection 5 in dotted lines connecting the junction of inductive resistor L1 and capacitor C1 to circuit 2.

The back modulation performed by the transponder may be resistive or capacitive. The present invention relates to a transponder with a resistive back modulation. The resistive back modulation includes connecting, in parallel with resonant circuit L2, C2, a resistor in series with a switch (generally, a MOS transistor). The switch is controlled according to the code to be transmitted (0 or 1) at the rate of the sub-carrier. The parallel connection is generally performed downstream of the rectifying bridge.

More and more, it is desired to integrate the entire transponder in a same silicon chip (antenna L2, capacitor C2 and circuit 13). Further, it is desired to minimize the surface area of the chip to miniaturize transponders, in particular in applications to electronic labels. An electronic label can then replace the printing of a conventional bar code to contain the identifier of a product.

A problem of conventional transponders is linked to the need to use a modulator-demodulator to convert a code (digital data, identification code of a label, etc.) to be transmitted to the read-write terminal. This need entails the necessary use of a storage (for example, a RAM, ROM, EPROM or EEPROM) of the code in binary form and of a modulation circuit upstream of the actual resistive back-modulation elements. This complexity adversely affects the miniaturization and the cost of present transponders.

Another disadvantage is that the programming of a binary code and, more generally, the writing of data in an electromagnetic transponder, requires at best a communication with a read-write terminal and a complex exchange protocol. At worst, in the case where it would be desired to store an immutable code in a one-time programming memory, it is necessary to write this code upon manufacturing in an EPROM or an EEPROM.

Another known technique is to increase the value of a resistance by optically submitting it to a laser which physically reduces its size. A disadvantage is the exorbitant price of the operation, which must be repeated for each chip. Another disadvantage is that the processing is optically visible, and thus detectable.

SUMMARY OF THE INVENTION

The present invention aims at overcoming the disadvantages of conventional transponders. In particular, the present invention aims at providing an electromagnetic transponder avoiding use of a digital modulator to transmit data stored in storage elements.

The present invention also aims at keeping the compatibility of the transponder with existing read-write terminals.

The present invention also aims at enabling simple programming of a binary code in an electromagnetic transponder. In particular, the present invention aims at avoiding use of a bidirectional communication to write a code in a transponder.

More generally, the present invention aims at enabling transmission, by an electromagnetic transponder, of any message without it being necessary to use a modulator of data stored in a digital memory.

The present invention also aims at making imperceptible, when inoperative, a code stored in an electromagnetic transponder.

The present invention also aims at enabling programming after manufacturing of the integrated circuit, while said circuit is in its environment of application.

To achieve these and other objects, the present invention provides an electromagnetic transponder including:

a parallel oscillating circuit adapted to extracting a supply signal from a radiated field;

in parallel with the oscillating circuit, several branches each including a programmable resistor and a switch; and an element of cyclic turn-on control of the switches, successively, each resistor forming an element for storing a portion of the code stored in the transponder.

According to an embodiment of the present invention, the resistors are made of polysilicon and are sized to have identical nominal values.

According to an embodiment of the present invention, the programming of a code portion in a resistor is controlled by forcing the flowing of a current in the polysilicon resistor which is greater than the current for which the value of this resistance is maximum.

According to an embodiment of the present invention, the programming current is extracted from a field radiated by a read-write terminal, of a power greater than the power of a read radiated field.

According to an embodiment of the present invention, the cyclic control element is formed of a shift register controlled by a clock signal, each switch being controlled by a bit of the shift register.

According to an embodiment of the present invention, the clock signal is extracted from the field radiated by a read-write terminal.

According to an embodiment of the present invention, a set input of the shift register is connected with the output of a NOR-type logic gate having its inputs receiving, in parallel, the bits of the shift register.

According to an embodiment of the present invention, the transponder includes a circuit for locking the stored code forbidding a second programming.

According to an embodiment of the present invention, the locking circuit includes an element for limiting the voltage across said branches, the regulation set point being a function of an additional polysilicon storage resistor, the value of which is decreased at the end of the programming.

According to an embodiment of the present invention, the transponder includes an assembly of synchronization branches each formed of a setting resistor and of a control switch, said synchronization branches being controlled by said cyclic control element.

According to an embodiment of the present invention, the programmable resistances are programmed at values selected from among several values, to store a multiple-level code.

According to an embodiment of the present invention, all its components are integrated on a same chip, having no input-output pad.

The present invention also provides a method for programming a code in a transponder, including temporarily and successively imposing, in each of the resistors of which the state is desired to be changed with respect to the unprogrammed state, the flowing of a constraint current greater than a current for which the value of this resistance exhibits a maximum.

According to an embodiment of the present invention, the constraint current is selected from a predetermined table of correspondence between the constraint current and the desired final resistance.

According to an embodiment of the present invention, the constraint current is selected from among several values to store a multiple-level code.

The foregoing objects, features and advantages of the present invention, will be discussed in detail in the following non-limiting description of specific embodiments in connection with the accompanying drawings.

DETAILED DESCRIPTION

Same elements have been referred to with same references in the different drawings. For clarity, only those elements necessary to the understanding of the present invention have been shown in the drawings and will be described hereafter. In particular, the different circuits of reading and exploitation of the data recovered by a read-write terminal have not been detailed. The present invention may be implemented whatever exploitation is made of the data.

A feature of the present invention is to use, as the storage element of data to be transmitted, directly the resistance value of a back modulation element formed of a switch in series with a resistor. Thus, according to the present invention, several back-modulation elements are provided in parallel with the oscillating circuit to modify its load. Another feature of the present invention is that the resistances of the different elements have different values according to the state (for example, 0 or 1) of the code portion that they transmit. The present invention uses the fact that, in the charging of the transponder's oscillating circuit in a different way, this difference can be interpreted by the terminal as signifying a different state of the bit transmitted by the transponder in its field.

Preferably, the resistors of the different parallel back modulation branches are all identically made of polysilicon and have the same nominal value. The programming is then performed by causing a stable and irreversible decrease of the value of the resistance associated with the branch, as will be better understood in relation with FIGS. 3 and 4.

Figure 2:
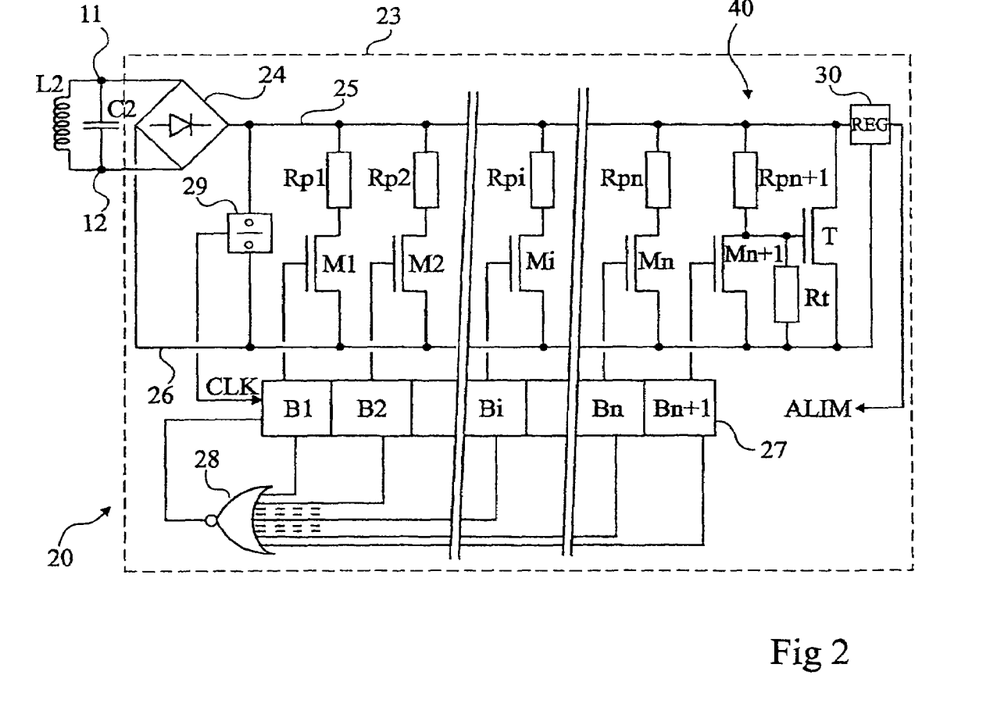
FIG. 2 shows an embodiment of an electromagnetic transponder according to the present invention.

FIG. 2 shows an embodiment of an electromagnetic transponder 20 according to the present invention.

As previously, transponder 20 includes a parallel oscillating circuit formed of an inductance L2, in parallel with a capacitor C2, between two input terminals 11, 12 of a control and processing circuit 23. Terminals 11 and 12 are connected to the input of a rectifying bridge 24 or the like having its outputs forming D.C. supply terminals 25, 26 of the circuits internal to the transponder.

According to the present invention, circuit 23 includes, in parallel between output terminals 25 and 26 of bridge 24, several (n) resistive back modulation elements, each formed of a resistor Rpi (i being included between 1 and n) and of a control switch Mi (for example, a MOS transistor). Each back modulation element is, according to the present invention, an element for storing a code portion. In fact, the value of resistance Rpi of each element is used to make out one state from another for the code portion represented by the involved element. As an alternative, the back modulation elements are connected between terminals 11 and 12. In this case, each element is associated with at least one rectifying diode and the back modulation only operates, preferably, one halfwave out of two of the high-frequency excitation signal (for example, the remote supply carrier at 13.56 MHz). Connecting the back modulation elements downstream of bridge 24 however has the advantage of saving space (less diodes).

To simplify, the case of a binary diode is considered, each element representing one bit of the code. However, the present invention more generally applies to a multiple-level or even analog coding since the smallest value difference between two resistances of two back modulation elements generates a difference in the load represented by the transponder on the oscillating circuit of an excite and read terminal.

The control of transistors Mi is performed in all or nothing. According to the present invention, this control is performed successively for each branch. Preferably, a cyclic control is provided so that the code represented by the bit sequence (in the binary case) is transmitted repetitively, for as long as the transponder is in the field of a read terminal.

According to the preferred embodiment illustrated in FIG. 2, a shift register 27 over n bits Bi (as many as there are back modulation elements to be controlled) or n+1 bits if a circuit 40 for locking the programmed code is provided, is used for this purpose. The output bits of the shift register are sampled in parallel towards the control gates of transistors Mi. Thus, each bit of the shift register is provided to a transistor Mi. In the example shown where transistors Mi are N-channel transistors, the register has a circulating "1", that is, a single bit in the register is at the high state (1), the other bits being low (0) to block the remaining n−1 transistors Mi. The obtaining of the circulating "1" at the register input is provided, for example, by a NOR-type logic gate 28 receiving as inputs the n bits of the shift register taken in parallel and the output of which provides the state of bit B1 at the starting (setting). As will be seen hereafter, gate 28 enables automatic starting of the register from as soon as it is supplied.

According to a preferred embodiment of the present invention, the sequencing of the register shifting is provided by a clock signal CLK deriving the clock frequency of the high-frequency excitation signal from the terminal. For this purpose, a frequency divider 29 is connected across terminals 25 and 26 (as an alternative, across terminals 11 and 12), and its output is connected to the clock input of shift register 27. The division rate of divider 29 depends on the frequency of the system's back modulation carrier. With the example of a carrier at 13.56 MHz and of a sub-carrier at 847.5 kHz, the division rate is 16.

The supply of register 27, of gate 28, and of divider 29 comes from a voltage regulator 30 connected between terminals 25 and 26 and the voltage of which provides a D.C. supply voltage ALIM, conventionally regulated.

Circuit 23 of FIG. 2 further includes, according to a preferred embodiment, a circuit 40 for locking the programmed code. This circuit includes, in the illustrated embodiment, an n+1-th back modulation element formed of a resistor Rpn+1 and a transistor Mn+1. The junction point of the transistor and of the resistor is connected to an N-channel MOS transistor T connected across terminals 25 and 26, and by a resistor Rt to terminal 26 (forming the ground in this example). The gate of transistor Mn+1 is connected to the output of an n+1-th bit of shift register 27. The operation of circuit 40 will be discussed hereafter, in relation with the preferred programming embodiment. It should for the moment only be noted that circuit 40 operates, after programming, like a regulator preventing the voltage across terminals 25 and 26 from exceeding a value likely to generate a reprogramming.

The reading of the code stored in a transponder in accordance with the preferred embodiment of the present invention is performed as follows.

In the idle state, all transistors Mi are off, since the transponder is not supplied (it has no autonomous power supply). As soon as the transponder enters the field of a read-write terminal, it picks up the remote supply carrier. Indeed, a terminal of a transponder system with no autonomous power supply permanently transmits to "wake up" the transponders entering its field. Thus, as soon as the transponder enters the field, a voltage appears across terminals 25 and 26. Regulator 30 then generates a voltage for supplying the different elements.

As soon as the supply voltage provided by the regulator is sufficient for shift register 27 to operate (as soon as it receives a clock signal CLK of divider 29 and a state 1 of gate 28), the transponder starts transmitting its code. Indeed, since initially no bit of the register contains a high state, gate 28 provides a high state to the input of register 27. The clock signal stores state 1 in bit B1. This turns on switch M1, which results in a back modulation with resistor R1. According to the value of resistance R1, the signal interpreted by the terminal provides a 1 or a 0. The transmission of the first bit is conditioned by signal CLK (which effectively corresponds to the back modulation sub-carrier). At the next period of clock CLK, the content of bit B1 is transferred to bit B2. This turns off transistor M1 and turns on transistor M2, and so on. The content of bit B1 is replaced by the state present at the output of gate 28. Now, as soon as a state 1 is present in the register, and thus as soon as the first bit B1 is loaded upon power-on, this output switches low (0) and remains so until the system is turned off by the disappearing of the power supply, and thus until the transponder comes out of the terminal's field.

All transistors Mi are thus successively controlled at the rate of clock CLK, which causes the transmission, by back modulation of the remote supply carrier, of the code stored by resistors Rpi. Further, the code transmission is cyclically repeated as long as the transponder remains supplied by its presence in the terminal's field. Even if transiently, two back modulation branches are active upon shifting of the circulating "1" in the register, the duration of this simultaneous conduction of two transistors Mi is negligible as compared to the back modulation period (for example, 847.5 kHz) and will not be taken into account by the terminal like another portion of the code.

Such an operation is particularly well adapted to electromagnetic labels or the like, which are desired to contain a code (generally, of identification of the product bearing them), and where the code is desired to be detected by the passing of the product in the field of a terminal (detection portal, automatic reading till, etc.).

An advantage of the present invention which already appears from the foregoing description is the extreme simplicity of the transponder. In particular, a transponder according to the present invention includes a small number of simple components. It is not necessary to use a digital memory imposing addressing and read/write circuits, nor a modulator/demodulator to provide the code. Further, a transponder according to the present invention can do without a microprocessor. Further, the forming of the polysilicon resistors requires no additional step with respect to those required to implement a MOS technology in which all components can be made (except for inductance L2). However, the inductance is generally integrated on the same chip. The transponder of the present invention is thus particularly advantageous to form an electronic label.

The programming of a code in a transponder according to the present invention is performed as follows. Preferably, all resistors Rpi are identically manufactured, so that they all have a same nominal value. This nominal value conditions a so-called unprogrammed state of the back modulation element and corresponds, for a binary code, to one of the two states (0 or 1).

A feature of the present invention is to provide a programming of a back modulation element to another state than the unprogrammed state by causing an irreversible decrease in the value of its resistance Rpi. For this purpose, the flowing of a current in the resistor which is greater than the current for which the value of the resistance exhibits a maximum is imposed. This feature of the present invention will be better understood hereafter in relation with FIGS. 3 and 4. For the time being, it will only be said that, if a sufficient current is conducted through a resistor Rpi, an irreversible decrease in the value of this resistor is caused when it conducts a nominal current again (corresponding to the operating current range for which it is designed). According to the present invention, the programming current (on the order of from one to ten milliamperes) is beyond the operating current range (up to one hundred microamperes).

According to a first embodiment, the terminals of resistors Rpi are accessible, preferably via a multiplexer type selector, from terminals of the integrated circuit chip. In this case, the programming is performed by applying, across each resistor, the value of which is desired to be decreased, a programming voltage enabling flowing of the programming current. The few circuits (multiplexer, etc.) necessary to the selection of the resistors must then be individually integrated in the transponder. As an alternative, if the number of back modulation elements is not too high, individual accesses through pads across each resistor may be provided. In the presence of locking circuit 40, resistor Rpn+1 is, at the end of the programming of all the other resistors, programmed to have its value decrease.

According to a second preferred embodiment, the transponder programming is performed in radiofrequency. A transmitter is then used, of read-write terminal type, having its remote supply carrier (for example, at 13.56 MHz) modulated in power between a first value which is not sufficient to modify the value of the resistances and a second value sufficient for the current flowing through one of the selected resistors Rpi to decrease the value of this resistance. The first power is however sufficient to supply the transponder and enable operation of its components. The modulation of the transmission power corresponds to the binary code to be stored in the transponder. Preferably, the modulation is performed at the rate of the transponder back modulation frequency. Thus, it is not necessary to independently control the switching from one back modulation element to the next one, this switching being automatically performed by shift register 27 of the transponder.

To form locking circuit 40 shown in FIG. 2, the programming must start with resistor Rp1 to end with resistor Rpn+1. Indeed, at the beginning, all resistors have their nominal value, including resistor Rpn+1 which is also polysilicon. Resistor Rpn+1 is, in manufacturing, sized for transistor T to limit the voltage across terminals 25 and 26 to a so-called programming level.

As long as transistor Mn+1 is not turned on, resistor Rt forms, with resistor Rpn+1, a control voltage divider for limiting transistor T. Resistor Rt is cyclically short-circuited by transistor Mn+1, which turns transistor T off.

During programming, the transmission power of the terminal is provided to be at the programming level when resistor Rpn+1 is reached. This results in a decrease in the value of this resistance which modifies the ratio between resistances Rpn+1 and Rt. Resistors Rpn+1 and Rt are sized so that, once the value of resistance Rpn+1 is decreased, transistor T limits the voltage across terminals 25 and 26 to a level smaller than the programming level (transistor T preferably operates in linear state). Accordingly, the transponder is protected against reprogramming, even if it is afterwards submitted to a field which is incidentally sufficient for, in principle, generating a value modification of the resistances. It is not necessary for the voltage to which transistor T limits the voltage to correspond to the use voltage. It is enough for it not to enable reaching the programming voltage, that is, as will be seen hereafter, a voltage such that the current conducted by the resistors is greater than a current for which these resistors have a maximum value.

The presence of circuit 40 results in that, in read mode, the code includes a predetermined bit at its end. This is however not disturbing.

The shift circuit illustrated in FIG. 2 is compatible with the fulfilling of the constraints due to the eventual programming of resistor Rpn+1. Indeed, since gate 28 controls the register so that it starts at bit B1 when the transponder is supplied, it is enough to trigger the starting of the transmitter (the terminal) when the transponder is in the field, that is, close. This is not a constraint in practice since the programming is a voluntary and specific operation. A special terminal with a base for receiving the transponder (guaranteeing a sufficient closeness) may for example be provided. The terminal is only triggered (both for transmission and power modulation) when the transponder to be programmed is in place.

An advantage of this solution is that this reduces or minimizes the number of circuits of the transponder. Indeed, no other circuit than those described in relation with FIG. 2 is necessary.

To program the back modulation resistors, several distinct phases may be dissociated in the product life. For example, a first group of back modulation branches (first series of resistors) programmable at the end of the manufacturing to contain a "manufacturer" code, is provided. The rest of the branches is left available to be programmed (in one or several goes) by the user (final or not).

According to an alternative embodiment not shown, a controlled synchronization of the shift register with the terminal is provided. For example, the terminal may be provided to first transmit at low power (read power) and the transponder may be provided to include a number of setting resistors sized at the manufacturing to give, for example, a state which is the inverse of that of the unprogrammed resistors Rpi. As an alternative, the setting resistors provide a predetermined code. By analyzing the back modulation, the terminal is then able to detect the position of the first programmable resistor in the cyclic reading, to synchronize the beginning of its power modulation. The setting resistors are of course also associated with a control transistor and with a bit of the shift register. As a result, they are also involved in the reading. They may either be taken into account in the construction of the codes to be stored, or, according to a preferred embodiment, be provided in polysilicon and programmed to lower values than the programmed value of resistances Rpi. In this latter case, a three-level code is obtained in read mode, the lowest level corresponding to the setting resistors. This enables synchronization also in read mode. This embodiment remains compatible with the use of locking circuit 40. Indeed, although the setting resistors are placed in the cycle, preferably, before resistors Rpi, and thus before resistor Rpi+1, it may be provided, before programming resistor Rpi+1, to run another cycle to program the setting resistors. Even if this cycle is provided after programming of the other resistors Rpi, if is enough, when running it for the second time, to do it at low power, so as not to modify the programmed code. This poses no problem due to the synchronization.

Figure 3:
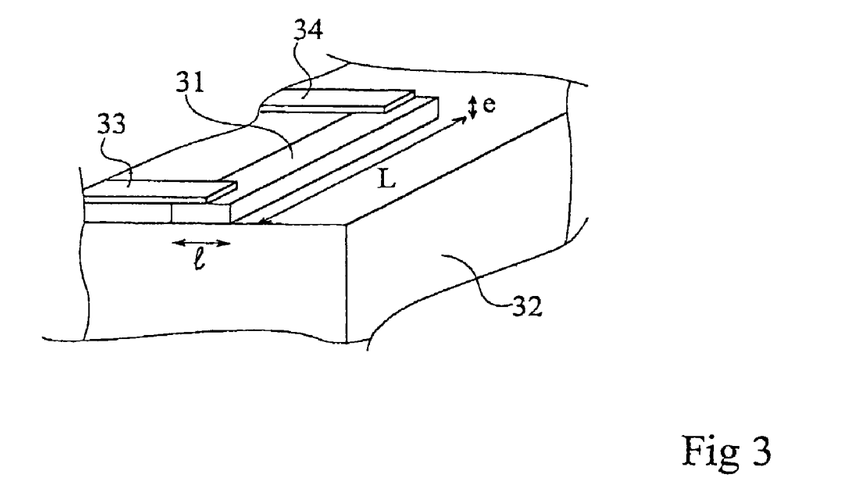
FIG. 3 shows in a very simplified partial perspective view an embodiment of a polysilicon resistor constitutive of a resistive back-modulation element of a transponder according to the present invention.

FIG. 3 shows an embodiment of a polysilicon resistor used to form resistors Rpi of the back modulation elements according to the preferred embodiment of the present invention.

Such a resistor (designated as 31 in FIG. 2) is formed of a polysilicon track (also called a bar) obtained by etching of a layer deposited on an insulating substrate 32. Substrate 32 is indifferently directly formed of the substrate of the integrated circuit supporting the transponder or is formed of an insulating layer forming an insulating substrate or the like for resistor 31. Resistor 31 is connected, by its two ends, to conductive tracks (for example, metal tracks) 33 and 34 for connecting the resistive bar to the other integrated circuit elements. The simplified representation of FIG. 3 makes no reference to the different insulating and conductive layers generally forming the integrated circuit. To simplify, only resistive bar 31 laid on insulating substrate 32 and in contact, by the ends of its upper surface, with the two metal tracks 33 and 34 has been shown. In practice, the connections of resistive element 31 to the other integrated circuit components are obtained by wider polysilicon tracks starting from the ends of bar 31, in the alignment thereof. In other words, resistive element 31 is generally formed by making a section of a polysilicon track narrower than the rest of the track.

Resistance R of element 31 is given by the following formula:

$$R = \rho(L/s),$$

where $\rho$ designates the resistivity of the material (polysilicon, possibly doped) forming the track in which element 31 is etched, where L designates the length of element 31, and where s designates its section, that is, its width l by its thickness e. Resistivity $\rho$ of element 31 depends, among others, on the possible doping of the polysilicon forming it.

Most often, upon forming of an integrated circuit, the resistors are provided by referring to a notion of so-called square resistance $R_\square$. This square resistance defines as being the resistivity of the material divided by the thickness with which it is deposited. Taking the above relation giving the resistance of an element 31, the resistance is thus given by the following relation:

$$R = R_\square \cdot L/l.$$

Quotient L/l corresponds to what is called the number of squares forming resistive element 31. This represents, as seen from above, the number of squares of given dimension depending on the technology, put side by side to form element 31.

The value of the polysilicon resistance is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

A feature of the present invention is to temporarily impose, in a polysilicon resistor (Rpi) of which the value is desired to be irreversibly decreased to modify the charge level generated on the transponder's oscillating circuit and thus code a different state, a programming or constraint current greater than a current for which the resistance reaches a maximum value, this current being beyond the normal operating current range (in back modulation) of this resistance. In other words, the resistivity of the polysilicon is decreased in the operating current range, in a stable and irreversible manner, by temporarily imposing in the corresponding resistive element the flowing of a current beyond the operating current range.

Another feature of the present invention is that the current used to decrease the resistance value is, conversely to a fusible element, non-destructive for the polysilicon element.

Figure 4:
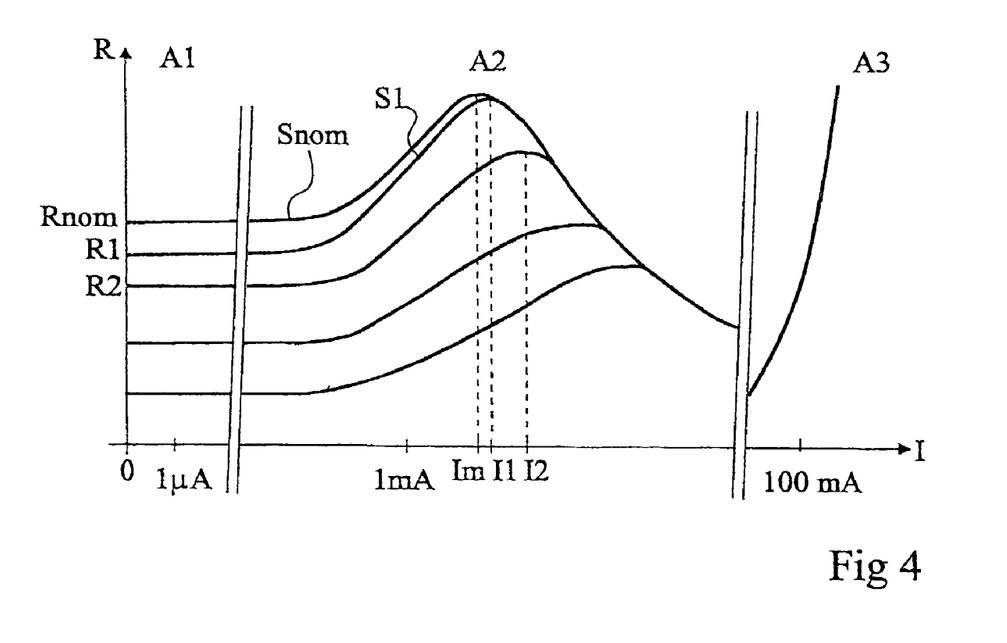
FIG. 4 illustrates, with a network of curves, the stabilization of the value of an electric path according to an embodiment of the present invention.

FIG. 4 illustrates, with a curve network giving the resistance of a polysilicon element of the type of that shown in FIG. 3 according to the current flowing therethrough, an embodiment of the present invention for stabilizing a cell by decrease of the value of one of its resistors.

It is assumed that the polysilicon having been used to manufacture resistive element 31 (Rpi) exhibits a nominal resistivity giving element 31, for the given dimensions l, L, and e, a resistance value $R_{nom}$. This nominal (original) value of the resistance corresponds to the value taken in a stable manner by resistive element 31 in the operating current range of the system, that is, generally, for current smaller than 100 µA.

According to the present invention, to decrease the value of the resistance and to switch in an irreversible and stable manner, for example, to a value R1 smaller than $R_{nom}$, a so-called constraint current (for example, I1), greater than a current Im for which the value of resistance R of element 31 is maximum without for all this being infinite, is imposed in resistive element 31. As illustrated in FIG. 4, once current I1 has been applied to resistive element 31, a stable resistance of value R1 is obtained in range A1 of operating currents of the integrated circuit. In fact, curve $S_{nom}$ of the resistance according to the current is stable for relatively small currents (smaller than 100 µA). This curve starts increasing for substantially higher currents on the order of a few milliamperes, or even more (range A2). In this current range, curve Snom crosses a maximum for value Im. The resistance then progressively decreases. In FIG. 4, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the value of the resistance or more specifically of the resistivity of the polysilicon element.

Indeed, once the maximum of curve Snom of the resistivity according to the current has been passed, the value taken by the resistance in the operating current range is smaller than value Rnom. The new value, for example, R1, depends on the higher value of the current (here, I1) which has been applied during the irreversible current phase. It should indeed be noted that the irreversible decrease performed by the present invention occurs in a specific phase of transponder personalization by writing of the code, outside of the normal read operating mode (range A1) of the integrated circuit, that is, outside of the normal operation of the resistor.

Theoretically, once the value of the polysilicon resistance has been lowered to a lower value (for example, R1 in FIG. 4), an irreversible decrease of this value can further be implemented. It is enough, to achieve this, to exceed maximum current I1 of the new curve S1 of the resistance according to the current. For example, the value of the current may be increased to reach a value I2. When the current is then decreased again, a value R2 is obtained for the resistor in its normal operating range. The value of R2 is smaller than value R1 and, of course, than value $R_{nom}$. Therefore, in the application to an electromagnetic transponder such as shown in FIG. 2, it is preferable to disable the capacitance of the back modulation element circuit to perform a new programming to avoid an incidental programming in the presence of a significant field.

It can be seen that all the curves of the resistance according to the current join on the decrease slope of the resistance value, after having crossed the maximum of the curve. Thus, for a given resistive element (ρ, L, s), currents I1, I2, etc. which must be reached, to switch to a smaller resistance, are independent from the value of the resistance (Rnom, R1, R2) from which the decrease is caused.

What has been expressed hereabove as the resistance value corresponds in fact to a decrease in the resistivity of the polysilicon forming the resistive element. The present inventors consider that the crystalline structure of the polysilicon is modified in a stable manner and that, in a way, the material is reflowed, the final crystalline structure obtained depending on the maximum current reached.

Of course, the programming current range A2 (on the order of a few milliamperes) should not be exceeded to avoid destroying the polysilicon resistor. This precaution will pose no problem in practice since the use of polysilicon to form a fuse requires much higher currents (on the order of one tenth of an ampere) which are not available once the circuit has been made.

The practical forming of a polysilicon resistor according to the present invention does not differ from the forming of a conventional resistor. Starting from an insulating substrate, a polysilicon layer is deposited and etched according to the dimensions desired for the resistor. Since the deposited polysilicon thickness is generally determined by the technology, the two dimensions which can be adjusted are the width and the length. Generally, an insulator is redeposited on the polysilicon bar thus obtained. In the case of an on-line interconnection, width 1 will have been modified with respect to the wider access tracks to be more strongly conductive. In the case of an access to the ends of the bar from the top as shown in FIG. 3, vias will be made in the overlying insulator (not shown) of the polysilicon bar to connect contact metal tracks 33 and 34.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible doping of the polysilicon, whatever its type, does not hinder the implementation of the present invention. The only difference due to the doping is the nominal resistivity before constraint and the resistivities obtained for given constraint currents. In other words, for an element of given dimensions, this conditions the starting point of the resistance value, and accordingly the resistance values obtained for given constraint currents.

To be able to apply the right values, the different currents to be applied to switch from the different resistance values to lower values are predetermined, for example, by measurements. For example, a test resistor which is submitted to an increase by steps of the current is used, returning after each increase to the operating current range to measure the obtained resistance value. The measured values will follow curve $S_{nom}$. Accordingly, the currents (I1, I2, FIG. 4) and the associated resistances (R1, R2) can be determined. The difference between the values of the table so obtained depends on the pitch selected for the increase by steps of the constraint current. This predetermination of course takes into account the nature of the polysilicon used, as well as preferentially that of the square resistance, that is, the resistivity of the material and the thickness with which it is deposited. Indeed, since the curves illustrated in FIG. 4 can also be read as curves of the square resistance, the calculated values can be transposed to the different resistors of an integrated circuit defined by the widths and the lengths of the resistive sections. The value of the constraint current to be applied to the resistive element to decrease its value in an irreversible and stable manner can then be predetermined. This determination enables setting the electromagnetic field, and thus the transmission power, to be provided by the contactless programming terminal, by high frequency. In the simplified embodiment when a mechanical access (pads) is provided to impose a programming voltage between terminals 25 and 26, this enables setting the necessary programming voltage. It should be noted that due to the desired effect (remarkable decrease in the value of the selected resistor), the accuracy of the constraint current is not critical as long as it is greater than the maximum current Im of the resistor. Preferably, a comfortable security margin will be provided to avoid for interval variations of the transponder in the field or other circuit tolerances to prevent the obtaining of the value decrease. For example, the circuit will be parameterized according to a constraint current providing a resistance value smaller than half the nominal value.

The curve change, that is, the decrease in the resistance value in normal operation, is almost immediate as soon as the corresponding constraint current is applied. "Almost immediate" means a duration of a few tens or even hundreds of microseconds which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, no additional duration of application of the constraint current modifies, at least at the first order, the obtained resistance. Moreover, even if given the predetermination measurements, it is considered that the influence of the duration of application of the constraint cannot be neglected, the preferred embodiment (predetermining constraint values in duration and intensity) is perfectly compatible with the talking into account of the duration of application of the constraint.

As a specific example of embodiment, an $N^+$ doped polysilicon resistor having a cross-section of 0.225 square micrometer (l=0.9 µm, e=0.25 µm) and a length L of 45 micrometers has been formed. With the polysilicon used and the corresponding doping, the nominal resistance was approximately 6300 ohms. This corresponds to a resistance per square of approximately 126 ohms (50 squares). By applying to this resistor a current greater than three milliamperes, a decrease of its value, stable for an operation under currents reaching 500 microamperes, has been caused. With a current of 3.1 milliamperes, the value of the resistance has been lowered to approximately 4500 ohms. By applying to the resistor a current of 4 milliamperes, the value of the resistance has been decreased down to approximately 3000 ohms. The obtained resistance values have been the same for constraint durations ranging from 100 microseconds to more than 100 seconds.

Of course, the above examples as well as the given orders of magnitude of currents and resistances for the different ranges concern present technologies. The currents of ranges A1, A2, and A3 may be different (smaller) for more advanced technologies and may be transposed to current densities. The principle of the present invention is not modified by this. There are still three ranges and the intermediary range is used to force the resistivity decrease.

In a simplified embodiment, locking circuit 40 will be omitted. Indeed, there is in practice little risk of having a transponder incidentally submitted to the programming powers due to the significant difference between the programming and operation currents. The locking circuit can thus be reserved for higher-security applications where a reprogramming of the code by a pirate is feared.

An advantage of the present invention is that it enables simple programming of a transponder, compatible with the structures of conventional terminals. It is enough to adapt their programming to have them operate with a transponder according to the present invention.

Another advantage of the present invention is that the code contained in the transponder can be programmed after manufacturing.

An advantage of the present invention is that it is compatible with conventional MOS transistor manufacturing technologies.

Another advantage of the present invention is that the code stored in the transponder is not optically detectable, conversely to a polysilicon resistor which would be used as a fuse where the physical damage on the silicon bar makes the programming visible.

Another advantage of the present invention is that with identically manufactured resistors, any pirate detection of the code outside of periods when said code is transmitted is avoided.

Another advantage of the present invention is that by enabling "contactless" programming of the transponder, a transponder can be obtained, formed on a single chip integrating all its components, which has no input-output pad.

It should be noted that the present invention is easily transposable from one technology to another.

Of course, the present invention is likely to have various alterations, modifications, and improvements which will readily occur to those skilled in the art. In particular, the sizing of the polysilicon resistors to obtain a nominal value depends on the application and is within the abilities of those skilled in the art based on the functional indications given hereabove. Similarly, the choice of the number of bits to be stored (and thus of the number of back modulation elements) in a transponder according to the present invention depends on its destination. Further, the values of the voltage or current constraints to implement the present invention are also within the abilities of those skilled in the art.

Further, although the present invention has been described in relation with an extreme simplification of the transponder, the use of several back modulation elements to directly store a code in a transponder can be envisaged with a control microprocessor or the like. For example, it may be provided to limit the number of back modulation cycles of the codes or to control their starting/stopping, especially to avoid collisions between the codes of several transponders. An example of application of such an alternative is the counting of products (inventories or automated store tills).

Finally, although the present invention has been described in relation with N-channel MOS transistors, its structure can be easily transposed to P-channel MOS transistors. It is enough to adapt the control of these transistors, for example, by providing a register (27, FIG. 2) with a circulating 0.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electromagnetic transponder including:
   a parallel oscillating circuit adapted to extracting a supply signal from a radiated field;
   in parallel with the oscillating circuit, several branches each including a programmable polysilicon resistor and a switch, each programmable polysilicon resistor storing a portion of a code stored in the transponder, each programmable polysilicon resistor having a nominal resistance value or a programmed resistance value that establishes a code state of the code portion without utilizing a switch to establish the code state of the code portion; and
   a cyclic control element for successively turning on the switches to read the code state of the code portion stored in the programmable polysilicon resistor of each of the branches; and
   programming of the code portion in the programmable polysilicon resistor being controlled by forcing a current in the resistor which is greater than the current for which its value is maximum and causing an ineversible decrease in resistance of the programmable polysilicon resistor, for each programmable polysilicon resistor that is programmed.

2. The transponder of claim 1, wherein the resistors are sized to have identical nominal values.

3. The transponder of claim 2, wherein the programming current is extracted from a field radiated by a read-write terminal, of a power greater than the power of a read radiated field.

4. The transponder of claim 1, wherein a programming current is extracted from a field radiated by a read-write terminal, of a power greater than the power of a read radiated field.

5. The transponder of claim 1, wherein the cyclic control element is formed of a shift register controlled by a clock signal, each switch being controlled by a bit of the shift register.

6. The transponder of claim 5, wherein the clock signal is extracted from the field radiated by a read-write terminal.

7. The transponder of claim 5, wherein a set input of the shift register is connected with the output of a NOR logic gate having its inputs receiving, in parallel, the bits of the shift register.

8. The transponder of claim 1, including a circuit for locking the stored code forbidding a second programming.

9. The transponder of claim 8, wherein the circuit for locking includes an element for limiting the voltage across said branches, the regulation set point being a function of an additional polysilicon storage resistor, the value of which is decreased at the end of the programming.

10. The transponder of claim 1, including an assembly of synchronization branches each comprising a setting resistor and a control switch, said synchronization branches being controlled by said cyclic control element.

11. The transponder of claim 1, wherein the programmable resistances are programmed at values selected from among several values, to store a multiple-level code.

12. The transponder of claim 1, wherein all its components are integrated on a same chip, having no input-output pad.

13. A method for programming a code in the transponder of claim 1, comprising temporarily and successively drawing, in each of the resistors of which the state is desired to be changed with respect to the unprogrammed state, a constraint current greater than a current for which the value of this resistance exhibits a maximum.

14. The method of claim 13, wherein the constraint current is selected from a predetermined table of correspondence between the constraint current and the desired final resistance.

15. The method of claim 13, wherein the constraint current is selected from among several values to store a multiple-level code.

16. An electromagnetic transponder comprising:
an oscillating circuit configured to extract a signal from a radiated field;
a plurality of branches in parallel with the oscillating circuit, each of the branches including a programmable resistor and a switch, wherein the programmable resistor in each of the branches comprises a programmable polysilicon resistor, wherein each resistor has a resistance that is programmable from a nominal value to a finite programmed value lower than the nominal value, each programmable resistor storing a portion of a code stored in the transponder, each programmable resistor having a nominal resistance value or a programmed resistance value that establishes a code state of the code portion without utilizing a switch to establish the code state of the code portion;
a control element for successively turning on the switches to read the code state of the code portion stored in the programmable resistor of each of the branches; and
means for programming the resistors by selectively applying a programming current which is greater than a current for which a resistance value is maximum and causing an irreversible decrease in resistance of the programmable polysilicon resistor, for each programmable polysilicon resistor that is programmed.

17. An electromagnetic transponder as defined in claim 16, wherein the programming current is extracted from the radiated field.

18. An electromagnetic transponder as defined in claim 16, wherein the control element comprises a shift register controlled by a clock signal, each of the switches being controlled by a bit of the shift register.

19. An electromagnetic transponder as defined in claim 18, wherein the clock signal is extracted from the radiated field.

20. An electromagnetic transponder as defined in claim 16, further comprising a locking circuit configured to prevent reprogramming of the resistors.

21. An electromagnetic transponder as defined in claim 16, wherein the programmed value of each resistor is selected from two or more values to provide a multiple level code.

22. A method for providing a code in an electromagnetic transponder, comprising:
providing an oscillating circuit to extract a signal from a radiated field;
providing a plurality of branches in parallel with the oscillating circuit, each of the branches including a programmable polysilicon resistor and a switch, each programmable polysilicon resistor storing a portion of a code stored in the transponder, each programmable polysilicon resistor having a nominal resistance value or a programmed resistance value that establishes a code state of the code portion without utilizing a switch to establish the code state of the code portion; and
successively turning on each of the switches and selectively applying to a corresponding branch a programming current which is greater than a current for which a resistance value of the programmable polysilicon resistor is maximum and which is less than a fusing current and causing an irreversible decrease in resistance of the programmable polysilicon resistor, for each programmable polysilicon resistor that is programmed.

23. A method as defined in claim 22, wherein selectively applying a programming current comprises extracting the programming current from the radiated field.

24. A method as defined in claim 22, wherein successively turning on each of the switches comprises turning on the switches with a shift register controlled by a clock signal.

25. A method as defined in claim 24, wherein the clock signal is extracted from the radiated field.

26. A method as defined in claim 22, further comprising locking the code after programming.

27. A method as defined in claim 22, wherein selectively applying a programming cuffent comprises selecting the programming current from two or more values to provide a multiple level code.

* * * * *

UNITED STATES PATENT AND TRADEMARK OFFICE
CERTIFICATE OF CORRECTION

PATENT NO. : 7,372,359 B2 Page 1 of 1
APPLICATION NO. : 10/364760
DATED : May 13, 2008
INVENTOR(S) : Luc Wuidart et al.

It is certified that error appears in the above-identified patent and that said Letters Patent is hereby corrected as shown below:

Col. 13, line 21 should read:
--taking into account of the duration of application of the --

Col. 15, line 1 claim 1 should read:
--which its value is maximum and causing an irreversible--

Col. 16, line 63 claim 27 should read:
--applying a programming current comprises selecting the--

Signed and Sealed this

Fifth Day of August, 2008

JON W. DUDAS
*Director of the United States Patent and Trademark Office*